(12) United States Patent
Kito (10) Patent No.: US 6,865,205 B2
(45) Date of Patent: Mar. 8, 2005

(54) SEMICONDUCTOR LASER

(75) Inventor: Masahiro Kito, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/145,145

(22) Filed: May 15, 2002

(65) Prior Publication Data

US 2002/0172248 A1 Nov. 21, 2002

(30) Foreign Application Priority Data

May 17, 2001 (JP) ........................................ 2001-147391

(51) Int. Cl.⁷ .............................................. H01S 5/30
(52) U.S. Cl. .............................. 372/46; 372/43; 372/45
(58) Field of Search ............................. 372/43, 45, 46

(56) References Cited

U.S. PATENT DOCUMENTS

| | | | |
|---|---|---|---|
| 4,468,850 A | | 9/1984 | Liau et al. |
| 5,255,281 A | * | 10/1993 | Sugano et al. ................ 372/46 |
| 5,260,822 A | | 11/1993 | Missaggia et al. ............ 372/46 |
| 5,400,353 A | | 3/1995 | Walpole et al. ............. 359/337 |
| 5,657,338 A | | 8/1997 | Kitamura |
| 5,689,358 A | * | 11/1997 | Nakao et al. ............... 359/248 |
| 6,104,738 A | * | 8/2000 | Kitoh et al. .................. 372/46 |
| 6,323,507 B1 | * | 11/2001 | Yokoyama et al. ........... 372/45 |
| 6,608,850 B1 | * | 8/2003 | Inaba .......................... 372/45 |

FOREIGN PATENT DOCUMENTS

| | | | |
|---|---|---|---|
| EP | 0 680 119 A1 | 11/1995 | |
| EP | 1 017 141 A2 | 7/2000 | |
| JP | 06 283802 A | 10/1994 | |
| JP | 07-154028 | 6/1995 | |
| JP | 2000-036638 | 2/2000 | |
| JP | 2000036638 | 2/2000 | |
| JP | 2000036638 A | * 2/2000 | ............ H01S/5/30 |

OTHER PUBLICATIONS

Kito, M. et al. "High Slope Efficiency and Low Noise Characteristics in Tapered–Active–Stripe DFB Lasers with Narrow Beam Divergence" Dec. 1999, IEEE J. of Quantum Electronics, vol. 35, pp. 1765–1770.*

Suzuki et al., "Beam Divergence of LDs with Laterally Tapered Active Stripe Taking Optical Reflection from Facets and Side Mesa–Walls into Account", pp. 1110, Oct. 1997, The 58th Technical Meeting of the Japan Society of Applied Physics (Extended Abstracts) 3p–ZC–4 together with an English translation.

Takemasa Tananuki et al. "High Power and Narrow Lateral far Field Divergence 1.5 μm—Eye–Safe Pulse Laser Diodes with Flared Waveguide", Proceedings of the International Conference on Indium Phosphide and Related Materials, pp. 725–728, May 9, 1995.

* cited by examiner

*Primary Examiner*—Minsun Oh Harvey
*Assistant Examiner*—Cornelius H. Jackson
(74) *Attorney, Agent, or Firm*—McDermott Will & Emery LLP (57) ABSTRACT

A semiconductor laser includes a substrate; and a multilayered film formed on the substrate and including an active layer. The multilayered film includes a stripe structure that extends in a longitudinal direction of a resonator and has a tapered portion in which a width of a stripe changes in a tapered manner; and a first side face and a second side face thatسandwich the stripe structure. At least one side face of the first side face and the second side face is inclined with respect to a principal surface of the substrate.

29 Claims, 9 Drawing Sheets

SEMICONDUCTOR LASER

BACKGROUND OF THE INVENTION

The present invention relates to a semiconductor laser, in particular, a semiconductor laser suitable for a light source for optical communication.

In recent years, in the field of optical communication, an optical communication technology for transmitting signal light emitted from a semiconductor laser through an optical fiber have been under development, and it is required to reduce the loss of the signal light in order that a photodetector on the signal receiving side efficiently can receive the signal light from the semiconductor laser that is the light source on the signal sending side. In order to reduce the loss of the signal light, a high coupling efficiency between the light emitted from the semiconductor laser and the optical fiber is required.

In general, the outgoing angle of laser light of a semiconductor laser is as wide as about 20 degrees to about 30 degrees, so that when laser light is directly coupled into an optical fiber without using an optical component such as a lens, only a low coupling efficiency such as several % can be achieved.

On the other hand, if an optical component such as a lens is inserted between a semiconductor laser and an optical fiber to focus the light, a high coupling efficiency can be achieved. However, the precision for aligning the semiconductor laser, the optical component and the optical fiber should be about 1 μm, and this need of alignment at a very high precision increases the cost due to facilities for precise processing or the like.

In order to solve these problems, the following method is under examination. The outgoing angle of the laser light of a semiconductor laser is set to about 10 degrees so as to reduce the spread of the laser light, and the laser light is coupled directly into an optical fiber. This type of a semiconductor laser that can achieve a narrow outgoing angle is disclosed in Japanese Laid-Open Patent Publication No. 2000-36638.

Figure 8A:
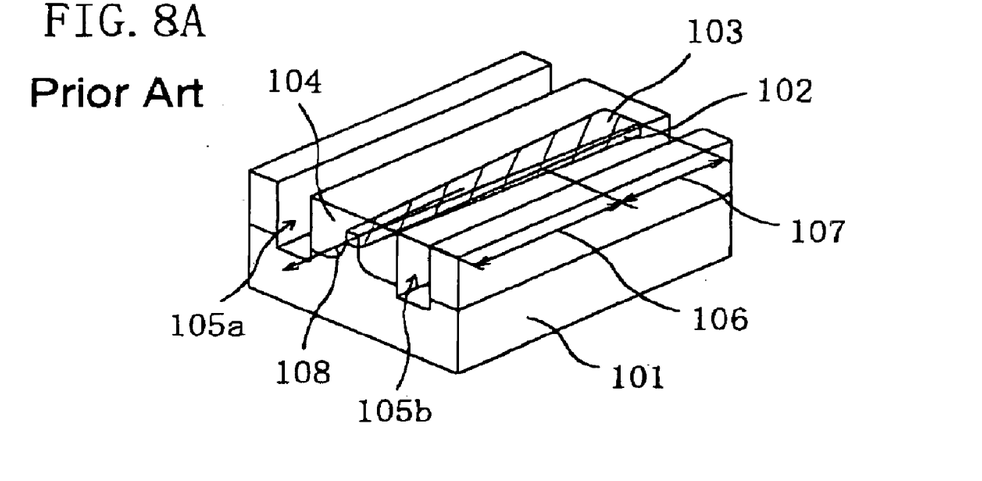
FIG. 8A is a perspective view of a known semiconductor laser transparently showing the stripe structure.
Figure 8B:
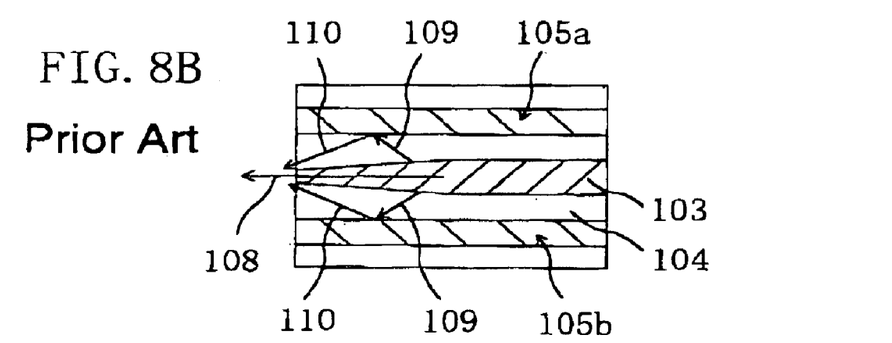
FIG. 8B is a view from the top of the known semiconductor laser transparently showing the stripe structure.
Figure 8C:
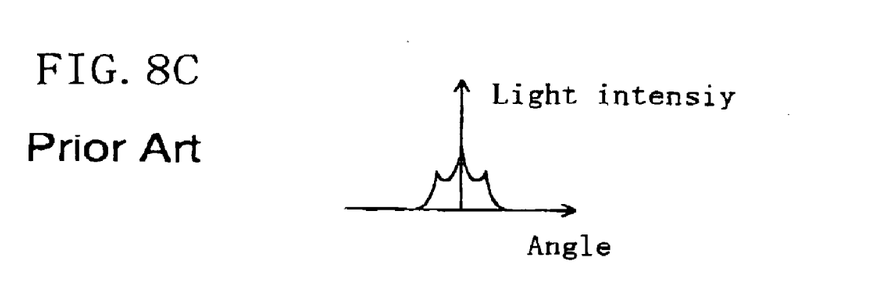
FIG. 8C is a view showing the light intensity pattern of the far-field pattern in the direction parallel to the laser light emitted from the known semiconductor laser.

This known semiconductor laser will be described with reference to FIGS. 8A to 8C. FIG. 8A is a perspective view of the known semiconductor laser, and FIG. 8B is a transparent view from the top of the known semiconductor laser transparently showing the stripe structure portion for active regions. FIG. 8C is a view showing the light intensity pattern of a far-field pattern of laser light emitted from the known semiconductor laser.

As shown in FIG. 8A, in the known semiconductor laser, a buried layer 104 made of InP is formed on a substrate 101 made of InP such that a stripe structure 103 including an active layer 102 is buried. Furthermore, a part of the buried layer 104 and a part of the substrate 101 are removed to form separating grooves 105a and 105b parallel to the central line of the stripe structure 103 across the entire resonator. The stripe structure 103 includes a tapered region 106 and a parallel region 107. The laser light 108 is emitted from the end face of the tapered region 106 of the stripe structure 103.

Regarding the light propagating from the parallel region 107 to the tapered region 106 in the stripe structure 103, light confinement to the active layer 102 is reduced continuously when the light is propagating in the tapered region 106. Therefore, leakage of light from the active layer 102 to the buried layer 104 is increased, so that the spot size of the laser light 108 at the end face for light emission becomes larger than that in the parallel region 107. Such an increase of the spot size of the laser light 108 means that the outgoing angle becomes narrow.

The separating grooves 105a and 105b are formed to increase the response speed when the semiconductor laser is directly modulated. This is because the electrical capacitance is decreased by the fact that in the burrier layer 104 as a current blocking layer, a voltage is applied only to the region sandwiched by the separating grooves 105a and 105b. Thus, the response speed when the separating grooves are provided can be faster than that when the separating grooves are not provided, so that the semiconductor laser having the separating grooves 105a and 105b is effective in the case where the semiconductor laser is modulated.

However, in the laser having a tapered stripe structure including the active layer 102, the light 109 leaked from the tapered region 106 (hereinafter, referred to as "radiated light") travels in the buried layer 104 adjacent to the active layer 102 in parallel to the substrate 101, as shown in FIG. 8B, and is reflected at the side walls of the separating grooves 105a and 105b. The reflected radiated light 110 still travels in the buried layer 104, and is emitted from the end face of the semiconductor laser to the outside together with the laser light 108 that is guided and travels in the active layer 102.

In this case, as shown in FIG. 8C, the radiated light 109 and the outgoing laser light 108 interfere with each other at the end face from which the laser light exits, so that a unimodal pattern of light intensity in the far-field pattern in the direction parallel to the substrate 101 cannot be obtained. Consequently, the utilization efficiency of the laser light with respect to the optical fiber is significantly decreased.

SUMMARY OF THE INVENTION

Therefore, with the foregoing in mind, it is a main object of the present invention to provide a semiconductor laser that can improve the utilization efficiency of laser light.

A semiconductor laser of the present invention includes a substrate; and a multilayered film formed on the substrate and including an active layer. The multilayered film includes a stripe structure that extends in a longitudinal direction of a resonator and has a tapered portion in which the width of a stripe changes in a tapered manner; and a first side face and a second side face that sandwich the stripe structure. At least one side face of the first side face and the second side face is inclined with respect to the principal surface of the substrate.

It is preferable that both of the first side face and the second side face are inclined with respect to the principal surface of the substrate.

It is preferable that a separating groove is formed on the substrate, and a side face of the separating groove is the first side face of the multilayered film.

In one preferable embodiment, the width WI of the stripe structure in a front end face and the width W2 of the stripe structure in a rear end face satisfy a relationship W1<W2, and the tapered portion of the stripe structure is a tapered region in which the width of the stripe structure changes continuously between the front end face and the rear end face.

In one preferable embodiment, the multilayered film further includes a buried layer in which the stripe structure is buried, and a contact layer formed on the buried layer.

In one preferable embodiment, the angle formed by the first side face or the second side face of the multilayered film and a surface of the contact layer is 105 degrees or more and 165 degrees or less.

In one preferable embodiment, the semiconductor laser according further includes a radiated light absorption layer having a band gap energy smaller than a band gap energy corresponding to a wavelength of laser light emitted from the semiconductor laser between the buried layer and the substrate.

In one preferable embodiment, the radiated light absorption layer is made of an InGaAs based material.

In one preferable embodiment, the angle formed by the first side face or the second side face of the multilayered film and a surface of the contact layer is 15 degrees or more and 75 degrees or less.

In one preferable embodiment, the contact layer is made of a material having a band gap energy smaller than a band gap energy corresponding to a wavelength of laser light emitted from the semiconductor laser.

In one preferable embodiment, the contact layer is made of an InGaAs based material.

In one preferable embodiment, the substrate and the buried layer are made of InP, and the active layer is made of InGaAsP.

Another semiconductor laser of the present invention includes a substrate; and a multilayered film formed on the substrate and including an active layer. The multilayered film includes a stripe structure that extends in a longitudinal direction of a resonator and has a tapered portion in which the width of a stripe changes in a tapered manner; a first side face and a second side face that sandwich the stripe structure; and a buried layer in which the stripe structure is buried. The angle formed by the first side face or the second side face and the principal surface of the buried layer is an obtuse angle or a sharp angle.

In one preferable embodiment, a contact layer made of an InGaAs based material is further formed on the buried layer. The substrate and the buried layer are made of InP. The active layer is made of InGaAsP.

In one preferable embodiment, a radiated light absorption layer made of an InGaAs based material is further formed between the buried layer and the substrate. The substrate and the buried layer are made of InP. The active layer is made of InGaAsP.

It is preferable that the formed angle is 105 degrees or more and 165 degrees or less.

It is preferable that the formed angle is 15 degrees or more and 75 degrees or less.

According to the semiconductor laser of the present invention, at least one side face of the first side face and the second side face is inclined with respect to the principal surface of the substrate, so that when the light radiated from the stripe structure is reflected at the first side face or the second side face, the reflected radiated light does not travel parallel to the substrate. Therefore, the reflected radiated light does not overlap the light distribution range of the laser light emitted from the stripe structure. Consequently, the utilization efficiency of the laser light can be improved.

DETAILED DESCRIPTION OF THE INVENTION

The inventors of the present invention conducted in-depth research on a semiconductor laser that can emit laser light having a unimodal light intensity pattern at a narrow outgoing angle, and reached such a semiconductor laser, and then achieved the present invention. The semiconductor laser of the present invention can improve the utilization efficiency of laser light with respect to optical wave guide (e.g., optical fibers). Moreover, even if a separating groove is formed in order to improve the response speed upon direct modulation, the semiconductor laser of the present invention can be realized, so that the advantage of not decreasing the modulation speed can be provided.

Before describing embodiments of the present invention, a technical example for avoiding an influence of the radiated light 109 in the structure shown in FIGS. 8A to 8C will be described with reference to FIGS. 9A to 9C. FIGS. 9B and 9C are cross-sectional views taken along line A-A' and line B-B', respectively.

Figure 9A:
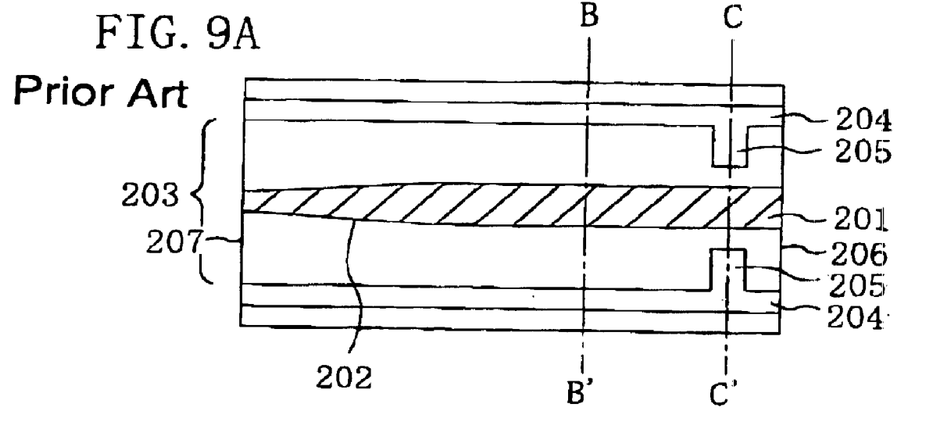
FIG. 9A is a view showing the end face from which laser light of a semiconductor laser that avoids an influence of radiated light.
Figure 9B:
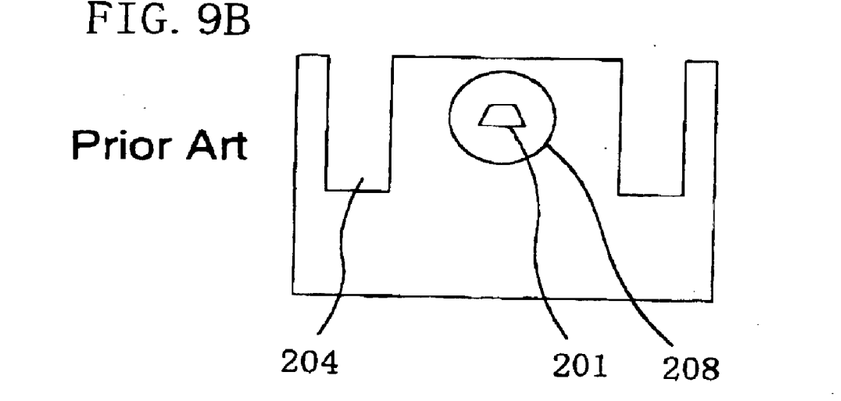
FIG. 9B is a cross-sectional view taken along line B-B' in FIG. 9A.
Figure 9C:
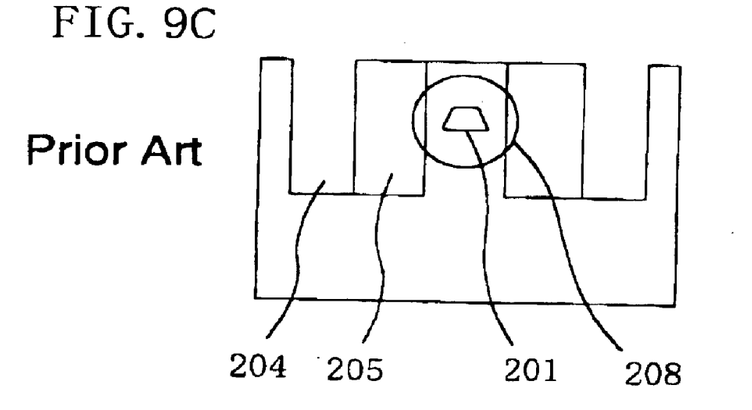
FIG. 9C is a cross-sectional view taken along line C-C' in FIG. 9A.

The structure shown in FIG. 9A is obtained by providing a recess 205 in the structure shown in FIG. 8B. More specifically, the recess 205 is provided in a part of a mesa groove 204 in order to prevent the radiated light from propagating in a resonator. In FIG. 9A, the recess 205 is located on the right side in the drawing (on the right side of the tapered portion), but it can be located in a central portion (tapered portion) or on the left side (the left side of the tapered portion), as long as the radiated light can be prevented from propagating in a resonator. Herein, reference numeral 201 denotes an active layer, reference numeral 202 denotes a spot size converter, reference numeral 203 denotes a mesa structure, reference numeral 204 denotes a mesa groove, reference numeral 205 denotes a recess, reference numeral 206 denotes a rear end face, reference numeral 207 denotes an end face from which light exits (hereinafter, referred to as "exit end face"), and reference numeral 208 is a light intensity distribution.

When the recess 205 is provided, the radiated light is prevented from propagating within the resonator, so that it appears that the influence of the radiated light can be avoided. However, in reality, the following problems arise. In the case of the structure shown in FIG. 9A, as shown in FIG. 9C, in the portion where the recess 205 is formed, the light intensity distribution 208 may be spread beyond the mesa structure 203. In particular, in order to realize a modulation band of 10 GHz or more, the width of the mesa structure 203 is about 5 μm and the mesa structure 203 in the region in which the recess 205 is formed is about 2 to 3 μm. In this case, as shown in FIG. 9C, the width of the mesa structure 203 is smaller than the spread of the light intensity distribution 208, and therefore the light intensity distribution 208 is spread beyond the mesa structure 203. As a result, a disturbance in the light intensity distribution 208 occurs, so that the unimodality of the outgoing pattern from the exit end face is lost.

Therefore, in the structure shown in FIG. 9A, even if the influence of the radiated light 109 can be avoided, it is difficult to emit laser light having a unimodal light intensity pattern.

In the present invention, the influence of the radiated light is avoided by not making the side face of the mesa structure perpendicular. Moreover, laser light having a unimodal light intensity pattern can be emitted. Hereinafter, embodiments of the present invention will be described with reference of the accompanying drawings. In the following drawings, for simplification of description, the same components having substantially the same function bear the same reference numeral. The present invention is not limited to the following embodiments.

First Embodiment

Figure 1A:
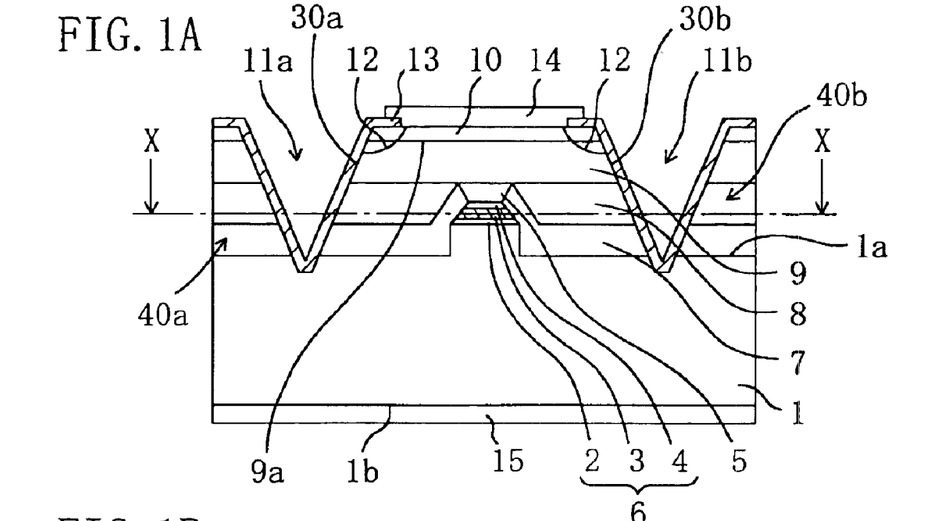
FIG. 1A is a view showing the end face from which laser light of a semiconductor laser of a first embodiment exits.
Figure 1B:
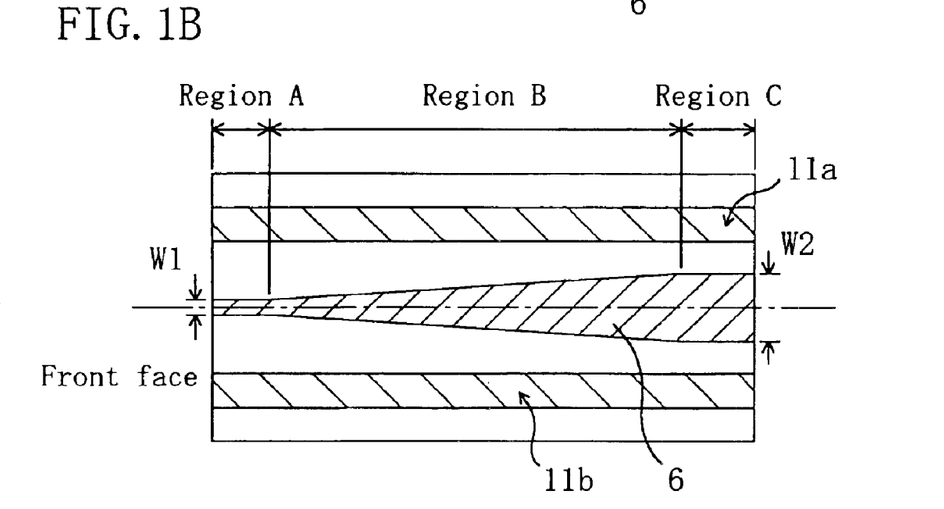
FIG. 1B is a cross-sectional view taken along line X—X in FIG. 1A.

Hereinafter, a semiconductor laser of a first embodiment of the present invention will be described with reference of FIGS. 1A and 1B. FIG. 1A is a view showing the exit end face for laser light of the semiconductor laser of the first embodiment of the present invention. FIG. 1B is a cross-sectional view taken along line X—X in FIG. 1A.

The semiconductor laser of this embodiment includes a substrate 1, a multilayered film (2, 3, 4, 5, 7, 8, 9, and 10) formed on the substrate 1. This multilayered film includes at least an active layer 3. The multilayered film has a stripe structure 6 (2 to 4) that extends in the longitudinal direction of the resonator and has a tapered portion (region B in FIG. 1B) in which the width of the stripe changes in a tapered manner, and this multilayered film includes a first side face 30a and a second side face 30b that sandwich the stripe structure 6. At least one side face of the first side face 30a and the second side face 30b is inclined with respect to the principal surface 1a of the substrate 1.

In the structure shown in FIG. 1, both the first side face 30a and the second side face 30b are inclined with respect to the principal surface 1a of the substrate 1. Separating grooves (11a, 11b) are formed in the substrate 1, and the side face (or side wall) of the separating groove 11a constitutes the first side face 30a of the multilayered film. Similarly, the side face (or side wall) of the separating groove 11b constitutes the second side face 30b of the multilayered film. Furthermore, in this structure, as shown in FIG. 1B, the width W1 in the front end face of the stripe structure 6 and the width W2 in the rear end face satisfy the relationship W1<W2. The stripe structure 6 has a region (tapered region) in which the width of the stripe structure 6 changes continuously.

Then, the structure of this embodiment will be described in greater detail. As shown FIG. 1A, a striped mesa portion is formed in the substrate 1 made of n-type InP. On the mesa portion, a light confinement layer 2 made of n-type $In_{1-x}Ga_xAs_yP_{1-y}$, where x=0.11 and y=0.24, and having a thickness of about 60 nm and λg of about 1.05 μm, a multiple quantum well active layer 3, and a light confinement layer 4 made of p-type $In_{1-x}Ga_xAs_yP_{1-y}$, where x=0.11 and y=0.24, and having a thickness of about 60 nm and λg of about 1.05 μm are formed in a mesa shape and extend in the longitudinal direction of the resonator in a stripe shape. A cladding layer 5 made of p-type InP and having a thickness of about 400 nm is formed on the light confinement layer 4. The hatched portion in FIG. 1B shows the stripe structure 6 and this stripe structure 6 includes the light confinement layer 2, the multiple quantum well active layer 3, and the light confinement layer 4.

Furthermore, a current blocking layer 7 made of p-type InP and a current blocking layer 8 made of n-type InP are formed on both sides of the stripe structure 6. A buried layer 9 made of p-type InP, and a contact layer 10 made of p-type $In_{1-x}Ga_xAs$, where x=0.47, are formed on the current blocking layer 8 and the cladding layer 5 in this order.

A part of the current blocking layers 7 and 8, the buried layer 9, the contact layer 10, and the substrate 1 is removed so as to form two striped separating grooves 11a and 11b having a V-shaped cross section on the opposite sides of the stripe structure 6.

The separating grooves 11a and 11b are formed parallel to the central line of the stripe structure 6 in the longitudinal direction of the resonator, and the width of the opening of each of the separating grooves 11a and 11b is about 30 μm. In the V-shaped separating groove 11a, a separating groove angle 12 formed by the side face of the separating groove 11a nearer the stripe structure 6 (first side face 30a) and the surface of the contact layer 10 is 135 degrees. It is sufficient that the separating groove angle 12 is in the range from 105 degrees to 165 degrees. Similarly in the separating groove 11b, a separating groove angle 12 formed by the side face of the separating groove 11b nearer the stripe structure 6 (second side face 30b) and the surface of the contact layer 10 is 135 degrees. It is sufficient that the separating groove angle 12 is in the range from 105 degrees to 165 degrees. The separating groove angle 12 of the separating groove 11a is not necessarily the same as that of the separating groove 11b. The first side face 30a and the second side face 30b are inclined with respect to the principal surface 1a of the substrate 1.

An etching technique can be used to form the separating grooves 11a and 11b such that the separating groove angle 12 is in the range from 105 degrees to 165 degrees. When the orientation of the substrate 1 is the (100) plane and the stripe structure 6 is formed in the <110> direction, the separating grooves 11a and 11b can be formed easily by using, for example, an isotropic etchant such as an acetic acid based etchant.

Furthermore, an insulating film 13 made of $SiO_2$ is formed on a portion from the separating grooves 11a and 11b up to a part of the contact layer 10, so that a striped window is formed on the contact layer 10. Furthermore, a p-side electrode 14 made of an alloy of Ti/Pt/Au is formed so as to cover the striped window of the insulating film 13, and is contact with the contact layer 10 through the window. The p-side electrode 14 can be made of a multilayered film or an alloy of Pt/Ti/Pt/Ti/Au. An n-side electrode 15 made of an alloy of Au/Sn is formed on the back surface 1b of the substrate 1. The n-side electrode 15 can be made of a multilayered film or an alloy of Au/Sn/Au.

The multiple quantum well active layer 3 includes 7 pairs of a well layer and a barrier layer. The well layer is an InGaAsP well layer to which a compressive strain is introduced within a range of about 0.7%, and having a thickness of about 6 nm. The InGaAsP well layer is made of, for example, $In_{1-x}Ga_xAs_yP_{1-y}$, where x—0.21 and y=0.68. The barrier layer is a InGaAsP barrier layer that has a thickness of about 10 nm and λg of about 1.05 μm, and to which a strain is not introduced intentionally. The InGaAsP well layer is made of, for example, $In_{1-x}Ga_xAs_yP_{1-y}$, where x=0.11 and y=0.24. The length of the resonator of the semiconductor laser is about 400 μm, and the width of the stripe structure 6 including the multiple quantum well active layer 3 is varied with respect to the longitudinal direction of the resonator. More specifically, the stripe width W1 in a region A about 25 μm apart from the front end face from which the laser light of the semiconductor laser exits is set to about 0.6 μm, whereas the stripe width W2 in a region C about 25 μm apart from the rear end face of the semiconductor laser is set to about 1.6 μm. In a region B (a region between the region A and the region C (hereinafter, also referred to as "tapered region"), the stripe width changes linearly so that the region A is connected to the region C. The oscillation wavelength of the semiconductor laser is in the vicinity of 1.3 μm.

Next, with reference to FIGS. 2A to 2C, the locus of the radiated light of the semiconductor laser of this embodiment will be described and also compared with the locus of the radiated light of the known semiconductor with reference to FIGS. 8A to 8C.

Figure 2A:
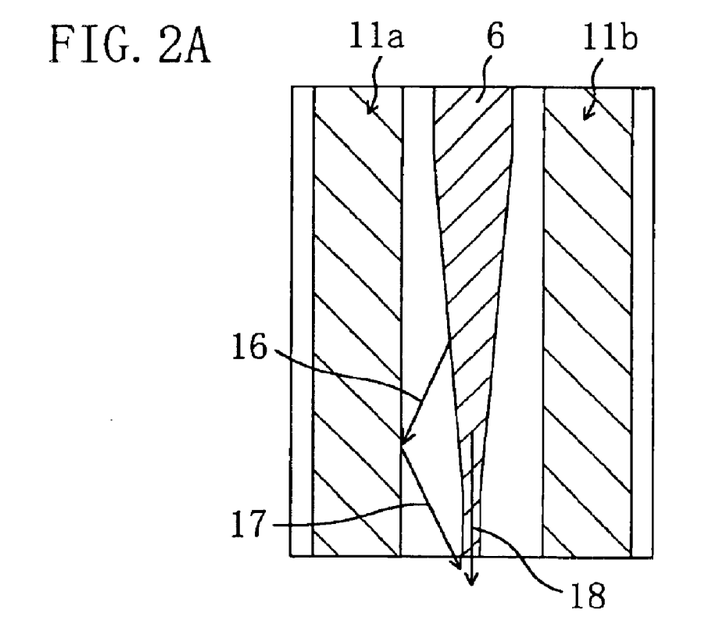
FIG. 2A is a view from the top of the semiconductor laser of the first embodiment transparently showing the stripe structure.
Figure 2B:
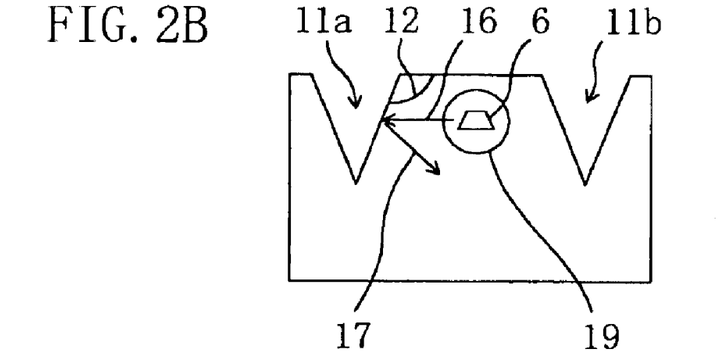
FIG. 2B is a view showing the end face from which laser light of the semiconductor laser of the first embodiment exits.
Figure 2C:
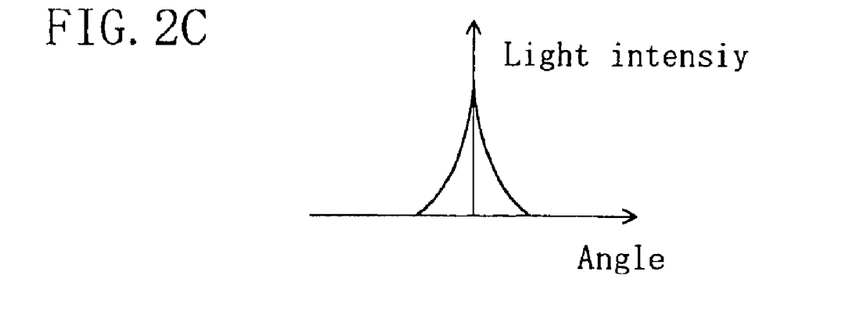
FIG. 2C is a view showing the light intensity pattern of the far-field pattern of the laser light emitted from the semiconductor laser of the first embodiment in the parallel direction.

FIGS. 2A, 2B and 2C are a top view of the semiconductor laser of this embodiment transparently showing the stripe structure, a view showing the exit end face for laser light, and a view showing the light intensity pattern of the far-field pattern of the emitted laser light in a parallel direction, respectively.

As shown in FIGS. 2A and 8B, when the semiconductor lasers are viewed from the above, the locus of the radiated light 16 of the semiconductor laser of this embodiment is the same as that of the radiated light 109 of the known semiconductor laser. More specifically, the radiated light 16 of FIG. 2A is reflected at the side walls of the separating grooves 11a and 11b, and the radiated light 109 of FIG. 8B is reflected at the side walls of the separating grooves 105a and 105b.

In the case of this embodiment, as shown in FIG. 2B, the separating groove angle is not 90 degrees, but for example, 135 degrees, so that the radiated light 17 reflected at the side wall of the separating groove 11a does not travel in the traverse direction of the stripe structure 6 parallel to the substrate 1, but travels toward the substrate 1. Therefore, the radiated light 16 viewed from the end face side of the semiconductor laser of this embodiment does not overlap the light distribution range 19 of the laser light 18 in the exit end face. Consequently, the radiated light 17 reflected at the side wall of the separating groove 11a does not interfere with the laser light 18, and thus the light intensity pattern in the far-field pattern in a direction parallel to the substrate 1 has a unimodal peak as shown in FIG. 2C.

On the other hand, as described above, in the case of FIG. 8B, a radiated light 110 obtained by the radiated light 109 being reflected at the side wall of the separating groove 11a interferes with the outgoing laser light 108. As a result, a unimodal light intensity pattern cannot be obtained. When the recess 205 for preventing the radiated light from propagating in the resonator is provided to avoid the influence of the radiated light 110, as shown in FIGS. 9A to 9C, the light intensity distribution is spread beyond the mesa structure. As a result, a disturbance occurs in the light intensity distribution, so that the pattern of outgoing light from the exit end face loses its unimodality.

In the semiconductor of this embodiment, when the radiated light 16 radiated from the stripe structure 6 is reflected at the first side face 30a or the second side face 30b, the reflected radiated light 17 does not travel parallel to the substrate 1, because the side faces 30a and 30b are not formed so as to be perpendicular to the substrate 1. Therefore, the reflected radiated light 17 does not overlap the light distribution range of the laser light 18 emitted from the stripe structure 6 and does not interfere with the laser light 18 in the exit end face for the laser light.

If it is possible that the reflected radiated light 17 reflected at the first side face 30a or the second side face 30b does not interfere with the laser light 18, the light intensity pattern in the far-field pattern in a direction parallel to the substrate 1 has a unimodal peak so that the coupling efficiency with an optical fiber can be increased, and thus the utilization efficiency of the laser light with respect to the optical fiber can be improved. Furthermore, since no optical component such as a lens is used in the coupling between the optical fiber and the semiconductor laser, so that a small optical module can be formed. The semiconductor laser of this embodiment can be optically coupled into, not only an optical fiber, but also can be optically coupled into a waveguide of a planar optical waveguide (PLC).

The reflected radiated light 17 may overlap the light distribution range 19 of the laser light 18 at the exit end face when the separating groove angle 12 becomes close to 90 degrees. On the other hand, when the separating groove angle 12 is too large and close to 180 degrees, a voltage is applied in a larger area, so that the electrical capacitance is increased. That is to say, in order to avoid the influence of the radiated light 17, it is preferable that the separating groove angle 12 is more than 90 degrees (obtuse angle), and in an extreme example, it may be 180 degrees. However, when the separating groove angle 12 is close to 180 degrees, an influence of the parasitic capacitance stars to appear, and when the influence of the parasitic capacitance becomes large, the modulation speed may drop. In view of these respects, it is preferable that the separating groove angle is in a preferable range (e.g., a range from 105 degrees to 165 degrees).

Figure 3:
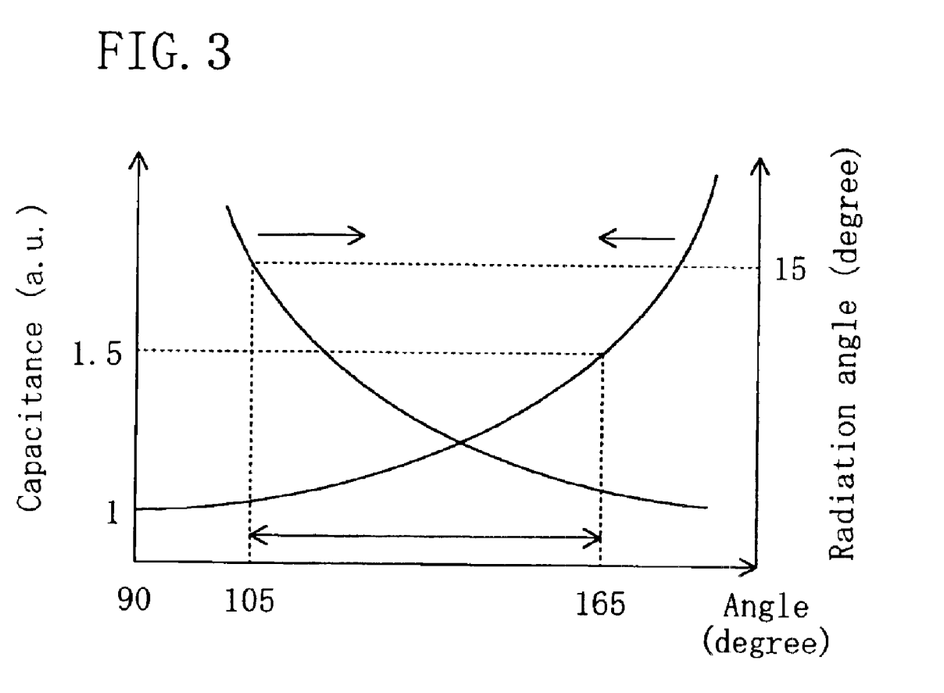
FIG. 3 is a graph showing the relationship of the capacitance and the radiation angle with respect to the angle of a separating groove.

FIG. 3 is a graph plotting the separating groove angle 12 in the horizontal axis to show the relationship of the capacitance and the radiation angle with respect to the separating groove angle 12. In FIG. 3, the values have been standardized with the separating groove angle 12 as 90 degrees, and the capacitance in the vertical axis is plotted in an arbitrary unit (a.u.) when a separating groove angle of 90 degrees is assumed to be 1. As shown in FIG. 3, when the separating groove angle 12 is in the range from 105 degrees to 165 degrees, an increase of the capacitance can be restricted to 50% or less, and the radiation angle is restricted to 15 degrees or less. In this range, there is no problem in practical use.

In this embodiment, the separating groove angle 12 is defined by the angle formed by the first side face 30a or the second side face 30b and the surface of the contact layer 10, but can be defined by an angle formed by the side face 30a or 30b and the principal surface 9a (upper surface) of the buried layer 9. In either case, the structure in which the side face 30a or 30b is inclined can be defined, based on the principal surface 1a (upper surface) of the substrate 1. When the buried layer 9 is made of n-type InP, the contact layer 10 may not necessarily be provided, because of the contact resistance. In this case, it is very convenient to define the separating groove angle 12 by the angel with the principal surface 9a of the buried layer 9. Herein, "principal surface" in the principal surface of the buried layer 9 or the principal surface of the substrate 1 typically means the upper surface, and for example, a surface that has a larger area, or a surface that extends in a horizontal direction in the structure shown in FIG. 1A or other drawings.

In the above description, only the separating groove 11a has been described, but the same is true for the separating groove 11b, and it is sufficient that at least one of the separating grooves 11a and 11b has a side wall inclined with respect to the substrate.

In the structure of this embodiment, in order to decrease the influence of the electrical capacitance (parasitic capacitance) that decreases the modulation speed, the separating grooves 11a and 11b are formed on in the substrate 1. However, in order to minimize the influence of such a parasitic capacitance, not only an embodiment in which a groove is formed in a part of the substrate, but also an embodiment in which a portion other than the multilayered film (mesa portion) interposed between the side faces 30a and 30b is removed, which corresponds to an embodiment in which the groove is made larger, can be effective. In order words, in the structure shown in FIG. 1A, the left side portion 40a in the drawing or the right side portion 40b that are provided on the substrate 1 can be removed.

Second Embodiment

Figure 4A:
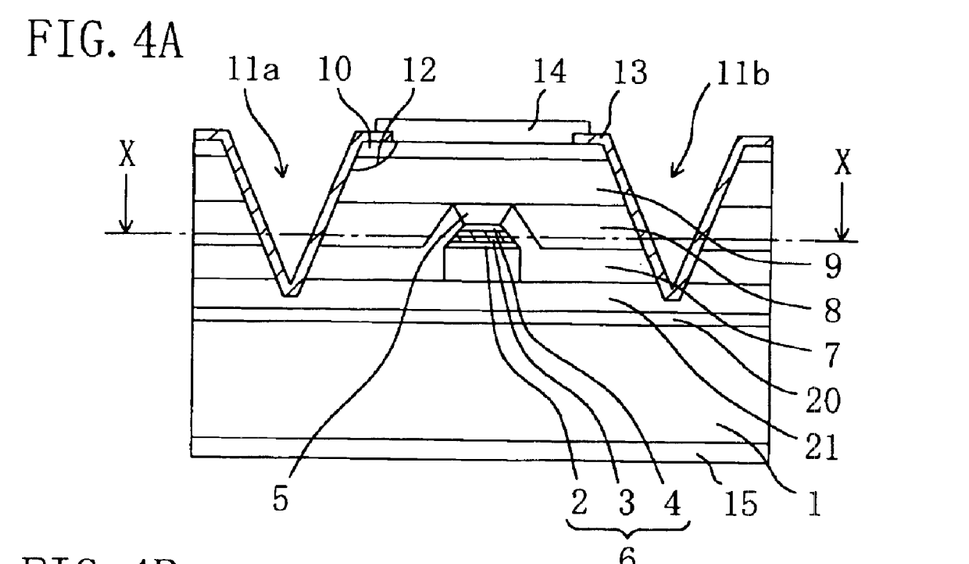
FIG. 4A is a view showing the end face from which laser light of a semiconductor laser of a second embodiment exits.
Figure 4B:
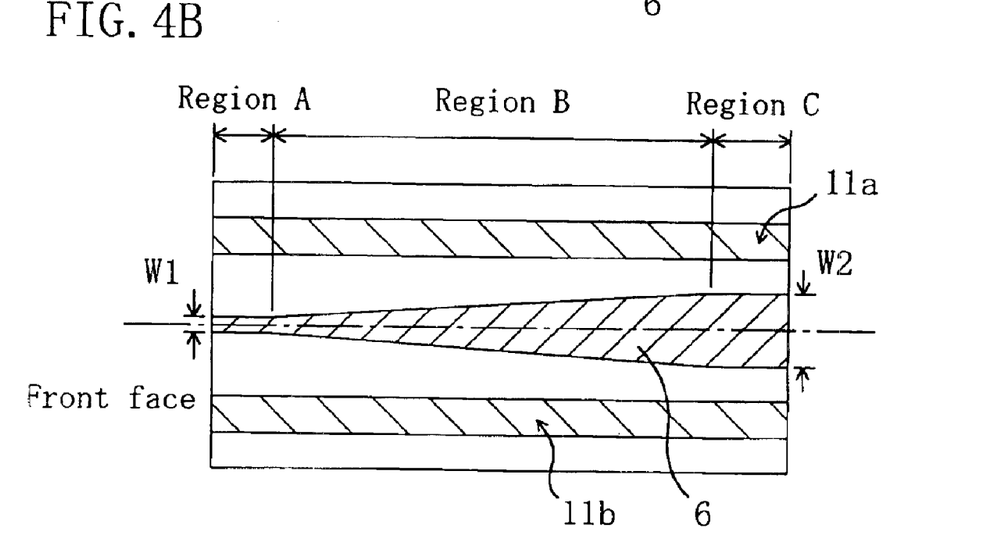
FIG. 4B is a cross-sectional view taken along line X—X in FIG. 4A.

Next, a semiconductor laser of a second embodiment of the present invention will be described with reference to FIGS. 4A and 4B. FIG. 4A is a view showing the exit end face for laser light of the semiconductor laser of the second embodiment of the present invention exits. FIG. 4B is a cross-sectional view taken along line X—X in FIG. 4A.

The semiconductor laser of the second embodiment of the present invention is structurally different from the semiconductor laser of the first embodiment in the following aspects. The striped mesa portion is not formed in the substrate 1, and a radiated light absorption layer 20 made of n-type $In_{1-x}Ga_xAs$, where x=0.47, that has a lattice match with InP and having a thickness of 0.1 μm is formed on the substrate 1, and a buffer layer 21 made of n-type InP is formed on the radiated light absorption layer 20. The buffer layer 21 is formed as a striped mesa portion and the stripe structure 6 is formed on the mesa portion. For the separating grooves 11a and 11b, the substrate 1 is not removed, but a portion up to a part of the buffer layer 21 is removed. However, the same effect can be obtained even if the portion up to the substrate 1 is removed. The same components as in the semiconductor laser of the first embodiment bear the same reference numeral and the description thereof is omitted.

The semiconductor laser of the second embodiment has a structure in which the radiated light reflected at the side walls of the separating grooves 11a and 11b is absorbed in the radiated light absorption layer 20. In order to absorb the radiated light, it is preferable that the band cap energy of the radiated light absorption layer 20 is smaller than that of the oscillation wavelength of the laser light.

In the semiconductor laser of the second embodiment, the radiated light that is reflected at the side walls of the separating grooves 11a and 11b and travels toward the substrate 1 can be absorbed in the radiated light absorption layer 20. Therefore, the radiated light reflected at the side walls of the separating grooves 11a and 11b is prevented from being further reflected at the substrate 1 and thus this embodiment provides double countermeasures against the interference of the radiated light with the laser light at the exit end face, so that the light intensity pattern in the far-field pattern in a direction parallel to the substrate 1 has a more unimodal peak.

Third Embodiment

Figure 5A:
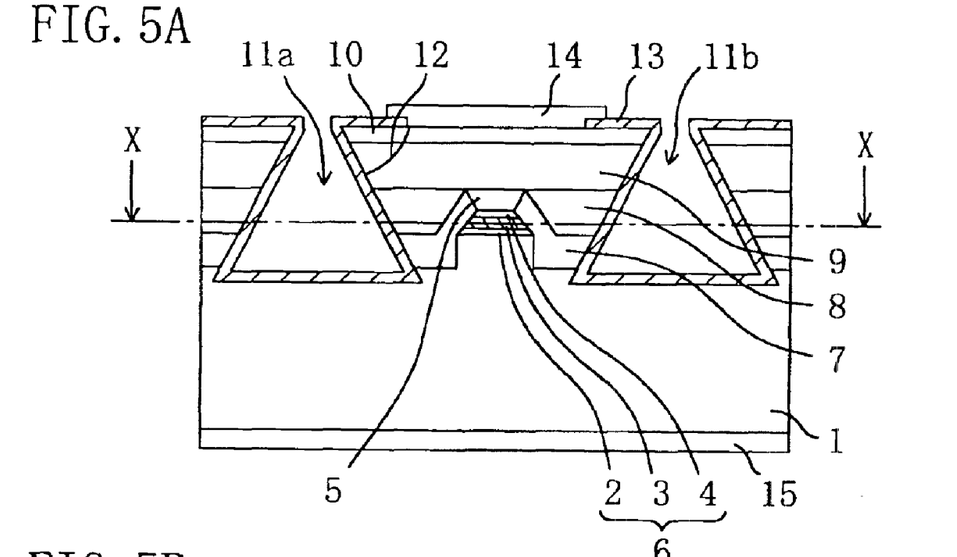
FIG. 5A is a view showing the end face from which laser light of a semiconductor laser of a third embodiment exits.
Figure 5B:
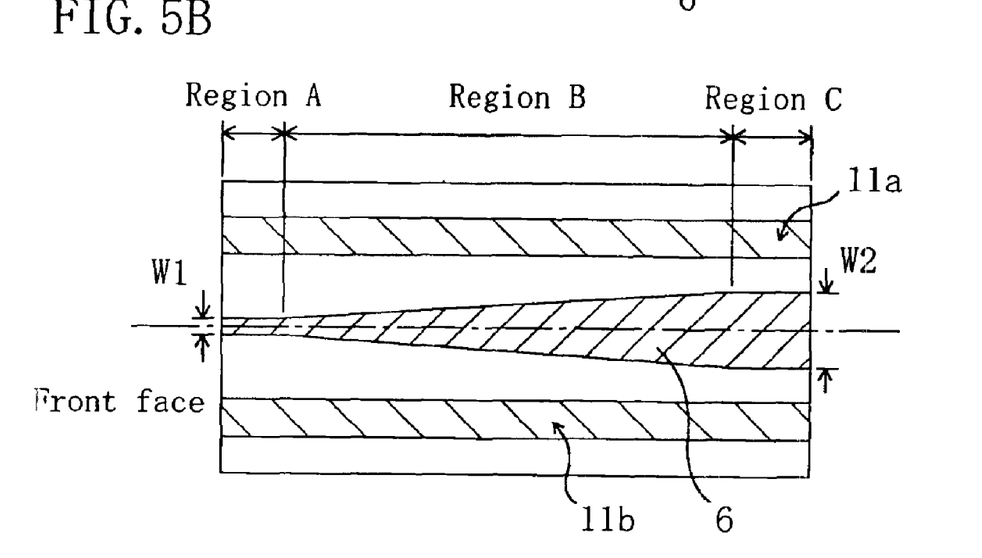
FIG. 5B is a cross-sectional view taken along line X—X in FIG. 5A.

Next, a semiconductor laser of a third embodiment of the present invention will be described with reference to FIGS. 5A and 5B. FIG. 5A is a view showing the end face from which the laser light of the semiconductor laser of the third embodiment of the present invention exits. FIG. 5B is a cross-sectional view taken along line X—X in FIG. 5A.

The semiconductor laser of the third embodiment of the present invention is different from the semiconductor laser of the first embodiment in that the separating groove angle 12 is in the range from 15 degrees to 75 degrees. In FIGS. 5A and 5B, the separating groove angle 12 is 60 degrees.

An etching technique can be used to form the separating grooves 11a and 11b such that the separating groove angle 12 is in the range from 15 degrees to 75 degrees. When the orientation of the substrate 1 is the (001) plane and the stripe structure 6 is formed in the <110> direction, the separating grooves 11a and 11b can be formed easily by using, for example, an anisotropic etchant such as a hydrochloric acid based etchant.

The same components as in the semiconductor laser of the first embodiment bear the same reference numeral and the description thereof is omitted.

Figure 6A:
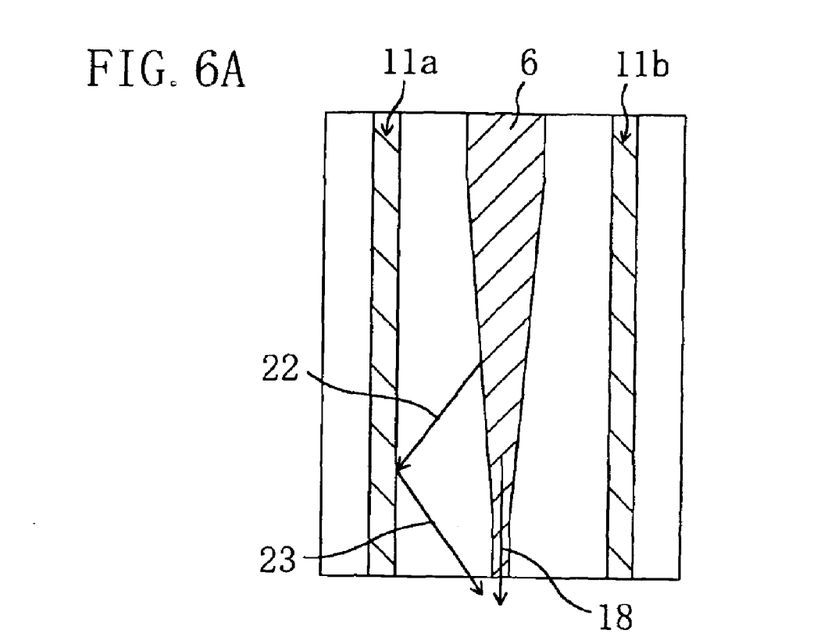
FIG. 6A is a view from the top of the semiconductor laser of the third embodiment transparently showing the stripe structure.
Figure 6B:
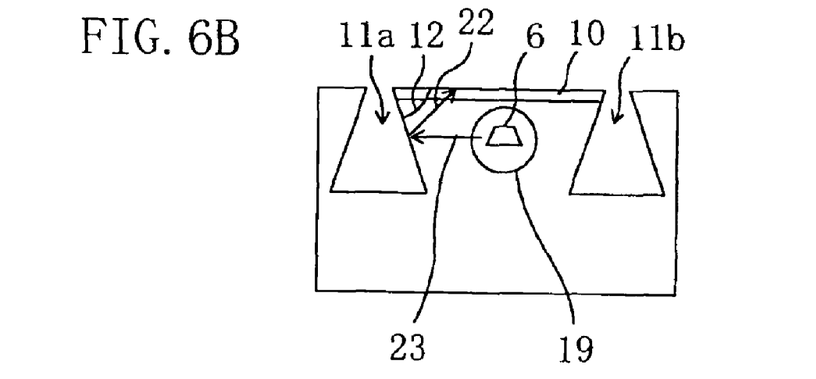
FIG. 6B is a view showing the end face from which laser light of the semiconductor laser of the third embodiment exits.
Figure 6C:
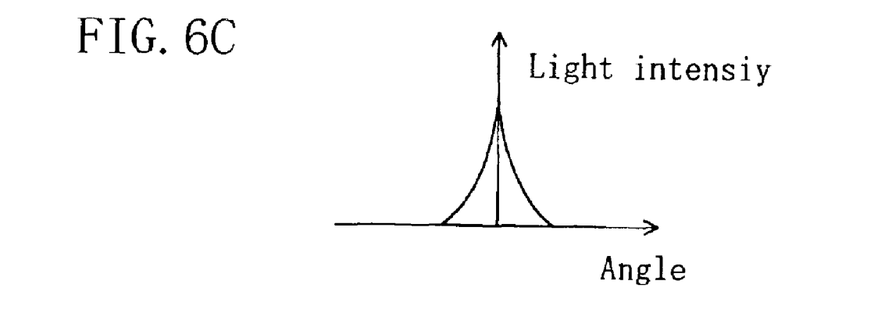
FIG. 6C is a view showing the light intensity pattern of the far-field pattern in the direction parallel to the laser light emitted from the semiconductor laser of the third embodiment.

Next, referring to FIGS. 6A to 6C, the locus of the radiated light of the semiconductor laser of the third embodiment of the present invention will be described. FIGS. 6A, 6B and 6C are a top view transparently showing the stripe structure, a view showing the exit end face for laser light, and a view showing the light intensity pattern of the far-field pattern of laser light in a parallel direction, respectively, in the semiconductor laser having a separating groove angle of 60 degrees of the third embodiment of the present invention. The same reference numerals in FIGS. 6A to 6C as those in FIGS. 5A and 5B denote the same components, so that the description thereof is omitted.

As shown in FIGS. 6A and 6B, in the semiconductor laser of the third embodiment of the present invention, the radiated light 22 that occurs in the tapered region of the stripe structure 6 and travels parallel to the substrate 1 travels within the current blocking layers 7 and 8 adjacent to the stripe structure 6 and is reflected at the side wall of the separating groove 11a. In this case, the separating groove angle 12 is 60 degrees, so that the reflected radiated light 23 does not travel in the traverse direction of the stripe structure 6 parallel to the substrate 1, but travels away from the substrate 1. Therefore, the radiated light 23 does not overlap the light distribution range 19 of the laser light 18 in the exit end face. Thus, similarly to the semiconductor laser of the first embodiment, the radiated light 23 reflected at the side wall of the separating groove 11a does not interfere with the laser light 18, and thus the light intensity pattern in the far-field pattern in a direction parallel to the substrate 1 has a unimodal peak as shown in FIG. 6C.

Furthermore, in the semiconductor laser of this embodiment, the radiated light 23 reflected at the side wall of the separating groove 11a is absorbed in the contact layer 10 made of $In_{1-x}Ga_xAs$, where x=0.47, having a band gap energy smaller than a band gap energy corresponding to 1.3 μm, which is the wavelength of the laser light. Therefore, the reflected radiated light 23 is not scattered in the semiconductor laser so that the laser light 18 does not overlap the light distribution range 19 of the laser light 18.

The reflected radiated light 23 may overlap the light distribution range 19 of the laser light 18 at the exit end face when the separating groove angle 12 becomes close to 90 degrees. On the other hand, when the separating groove angle 12 is too small, a multilayered structure including the stripe structure 6 between the separating grooves 11a and 11b is separated from the substrate 11, so that this device does not function as a semiconductor laser. Moreover, in order to avoid the influence of the radiated light, it is sufficient that the separating groove angle 12 is an angle of less than 90 degrees (sharp angle), and in an extreme example, it may be close to 0 degree. However, when the separating groove angle 12 is close to 0 degree, an influence of the parasitic capacitance stars to appear, and when the influence of the parasitic capacitance becomes large, the modulation speed may drop. In view of these respects, it is preferable that the separating groove angle is in a preferable range (e.g., a range from 15 degrees to 75 degrees).

Figure 7:
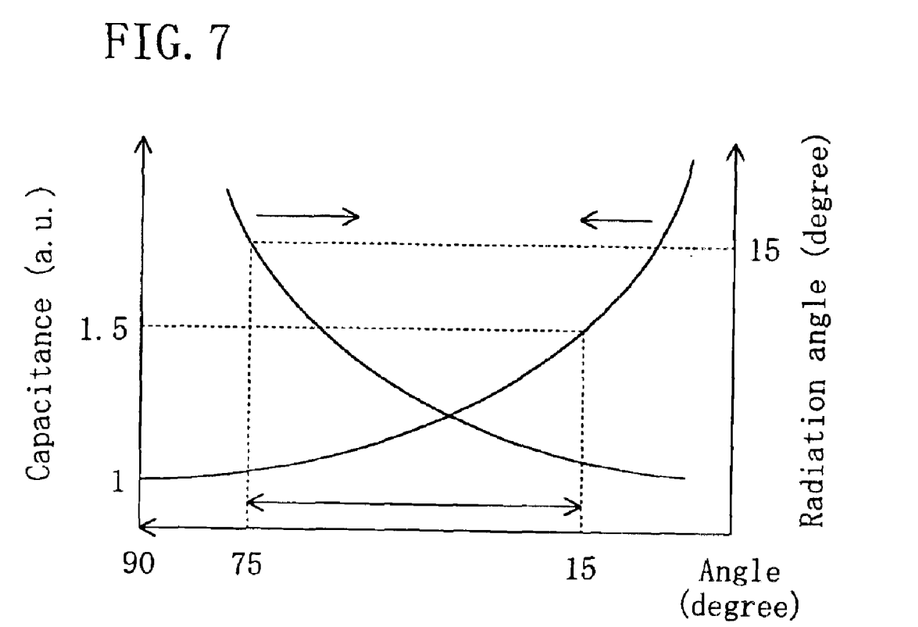
FIG. 7 is a graph showing the relationship of the capacitance and the radiation angle with respect to the angle of a separating groove.

FIG. 7 is a graph plotting the separating groove angle 12 in the horizontal axis to show the relationship of the capacitance and the radiation angle with respect to the separating groove angle 12. In FIG. 7, the values have been standardized with the separating groove angle 12 as 90 degrees, and the capacitance in the vertical axis is plotted in an arbitrary unit (a.u.) when a separating groove angle of 90 degrees is assumed to be 1. As shown in FIG. 7, when the separating groove angle 12 is in the range from 15 degrees to 75 degrees, an increase of the capacitance can be restricted to 50% or less, and the radiation angle is restricted to 15 degrees or less. In this range, there is no problems in practical use.

In the above description, only the separating groove 11a has been described, but the same is true for the separating groove 11b, and it is sufficient that at least one of the separating grooves 11a and 11b has a side wall inclined with respect to the substrate.

The band gap energy of the contact layer 10 is not necessarily smaller than the energy of the laser light 18, and the contact layer 10 may be, for example, $In_{1-x}Ga_xAs_yP_{1-y}$, where x=0.22, y=0.48, having a composition wavelength of 1.2 μm. That is to say, even if the contact layer 10 does not absorb the radiated light, the effect of avoiding the influence of the radiated light can be obtained by not making the side face of the mesa structure perpendicular. Furthermore, even if InGaAsP having a composition wavelength of 1.2 μm is used, the original function of the contact layer 10 regarding the contact resistance (in particular, in the case where the buried layer 9 is made of InP) can be provided.

In the above embodiments, the oscillation wavelengths of the semiconductor laser devices of the first to third embodiments are in the 1.3 μm band, but it can be in the 1.55 μm band or other oscillation wavelengths can be used. Furthermore, the semiconductor laser devices of the first to third embodiments has a structure of a Fabry-Perot semiconductor laser, but can have a structure of distributed feedback type lasers (DFB lasers) in which a diffraction grating is formed in the vicinity of the active layer (e.g., the substrate near the active layer).

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor laser comprising: a substrate; and a multilayered film formed on the substrate, the multilayered film comprising: a stripe structure comprising an active layer, said stripe structure extends in a longitudinal direction of a resonator and has a tapered portion in which a width of a stripe changes in a tapered manner; and a first side face and a second side face that sandwich the stripe structure, said first side face and said second side face being spaced apart from said stripe structure; wherein at least one side face of the first side face and the second side face is inclined with respect to a principal surface of the substrate, said one side face being inclined with respect to the principal surface of the substrate reflecting, toward the substrate, a radiated light radiated from said stripe structure.

2. The semiconductor laser according to claim 1, wherein both of the first side face and the second side face are inclined with respect to the principal surface of the substrate.

3. The semiconductor laser according to claim 1, wherein
   a separating groove is formed on the substrate, and
   a side face of the separating groove is the first side face of the multilayered film.

4. The semiconductor laser according to claim 1, wherein said radiated light does not interfere with an output light emitted from said stripe structure.

5. The semiconductor laser according to claim 1, wherein
   a width W1 of the stripe structure in a front end face and a width W2 of the strip structure in a rear end face satisfy a relationship W1<W2, and
   the tapered portion of the stripe structure is a tapered region in which the width of the stripe structure changes continuously between the front end face and the rear end face, said front end face corresponding to the end of said striped structure from which the output light of said laser is emitted.

6. The semiconductor laser according to claim 5, wherein the substrate and the buried layer are made of InP, and the active layer is made of InGaAsP.

7. The semiconductor laser according to claim 1, wherein the multilayered film further includes a buried layer in which the stripe structure is buried, and a contact layer formed on the buried layer.

8. The semiconductor laser according to claim 7, wherein an angle formed by the first side face or the second side face of the multilayered film and a surface of the contact layer is 105 degrees or more and 165 degrees or less.

9. The semiconductor laser according to claim 7, further comprising a radiated light absorption layer having a band gap energy smaller than a band gap energy corresponding to a wavelength of laser light emitted from the semiconductor laser between the buried layer and the substrate, said radiated light absorption layer absorbing said radiated light.

10. The semiconductor laser according to claim 9, wherein the radiated light absorption layer is made of an InGaAs based material.

11. The semiconductor laser according to claim 7, wherein the contact layer is made of a material having a band gap energy smaller than a band gap energy corresponding to a wavelength of laser light emitted from the semiconductor laser.

12. The semiconductor laser according to claim 11, wherein the contact layer is made of an InGaAs based material.

13. A semiconductor laser comprising:
    a substrate; and
    a multilayered film formed on the substrate, the multilayered film comprising
        a stripe structure comprising an active layer, said stripe structure extends in a longitudinal direction of a resonator and has a tapered portion in which a width of a stripe changes in a tapered manner;
        a first side face and a second side face that sandwich the stripe structure; and a buried layer in which the stripe structure is buried, said first side face and said second side face being spaced apart from said stripe structure;
    wherein an angle formed by the first side face or the second side face and a principal surface of the buried layer is an obtuse angle or a sharp angle,
    said one side face being inclined with respect to the principal surface of the substrate reflecting a radiated light radiated from an output light emitted from said stripe structure such that said radiated light does not interfere with said output light emitted from said stripe structure.

14. The semiconductor laser according to claim 13, wherein
    a contact layer made of an InGaAs based material is further formed on the buried layer,
    the substrate and the buried layer are made of InP, and
    the active layer is made of InGaAaP.

15. The semiconductor laser according to claim 13, wherein
    a radiated light absorption layer made of an InGaAs based material is further formed between the buried layer and the substrate,
    the substrate and the buried layer are made of InP, and the active layer is made of InGaAsP.

16. The semiconductor laser according to claim 13, wherein the formed angle is 105 degrees or more and 165 degrees or less.

17. The semiconductor laser according to claim 13, wherein the formed angle is 15 degrees or more and 75 degrees or less.

18. A semiconductor laser comprising: a substrate; and a multilayered film formed on the substrate, the multilayered film comprising: a stripe structure comprising an active layer, said stripe structure extends in a longitudinal direction of a resonator and has a tapered portion in which a width of a stripe changes in a tapered manner and a first side face and a second side face that sandwich the stripe structure, said first side face and said second side face being spaced apart from said stripe structure; wherein at least one side face of the first side face and the second side face is inclined with respect to a principal surface of the substrate, said one side face being inclined with respect to the principal surface of the substrate reflecting, away from the substrate, a radiated light radiated from said stripe structure.

19. The semiconductor laser according to claim 18, wherein both of the first side face and the second side face are inclined with respect to the principal surface of the substrate.

20. The semiconductor laser according to claim 18, wherein
    a separating groove is formed on the substrate, and
    a side face of the separating groove is the first side face of the multilayered film.

21. The semiconductor laser according to claim 18, wherein
    a width W1 of the stripe structure in a front end face and a width W2 of the stripe structure in a rear end face satisfy a relationship W1<W2, and
    the tapered portion of the stripe structure is a tapered region in which the width of the stripe structure changes continuously between the front end face and the rear end face, said front end face corresponding to the end of said striped structure from which the output light of said laser is emitted.

22. The semiconductor laser according to claim 18, wherein the substrate and the buried layer are made of InP, and the active layer is made of InGaAsP.

23. The semiconductor laser according to claim 18, wherein said radiated light does not interfere with an output light emitted from said stripe structure.

24. The semiconductor laser according to claim 18, wherein the multilayered film further includes a buried layer in which the stripe structure is buried, and a contact layer formed on the buried layer.

25. The semiconductor laser according to claim 24, further comprising a radiated light absorption layer having a band gap energy smaller than a band gap energy corresponding to a wavelength of laser light emitted from the semiconductor laser between the buried layer and the substrate, said radiated light absorption layer absorbing said radiated light.

26. The semiconductor laser according to claim 25, wherein the radiated light absorption layer is made of an InGaAs based material.

27. The semiconductor laser according to claim 24, wherein an angle formed by the first side face or the second side face of the multilayered film and a surface of the contact layer is 15 degrees or more and 75 degrees or less.

28. The semiconductor laser according to claim 27, wherein the contact layer is made of a material having a band gap energy smaller than a band gap energy corresponding to a wavelength of laser light emitted from the semiconductor laser.

29. The semiconductor laser according to claim 28, wherein the contact layer is made of an InGaAs based material.

* * * * *